US011963335B2

(12) United States Patent
Paavola et al.

(10) Patent No.: US 11,963,335 B2
(45) Date of Patent: Apr. 16, 2024

(54) HEATSINK WITH A SANDWICH PLATE CONSTRUCTION

(71) Applicant: Intel Corporation, Santa Clara, CA (US)

(72) Inventors: Juha Tapani Paavola, Hillsboro, OR (US); Jerrod Peterson, Hillsboro, OR (US); Justin M. Huttula, Portland, OR (US); Ellann Cohen, Hillsboro, OR (US); Ruander Cardenas, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 780 days.

(21) Appl. No.: 16/914,053

(22) Filed: Jun. 26, 2020

(65) Prior Publication Data

US 2020/0337178 A1 Oct. 22, 2020

(51) Int. Cl.
*H05K 1/02* (2006.01)
*H05K 7/20* (2006.01)

(52) U.S. Cl.
CPC ......... *H05K 7/2039* (2013.01); *H05K 1/0203* (2013.01); *H05K 7/20336* (2013.01); *H05K 2201/2036* (2013.01)

(58) Field of Classification Search
CPC .. H05K 1/0209; H05K 7/2039; H05K 1/0201; H05K 1/021; H05K 1/0203; H05K 7/20963
See application file for complete search history.

(56) References Cited

U.S. PATENT DOCUMENTS

2004/0070933 A1* 4/2004 Sarraf .................. H01L 23/427 257/E23.088
2010/0328878 A1* 12/2010 Fujiwara ................ G06F 1/203 361/679.48

FOREIGN PATENT DOCUMENTS

WO WO 2017171893 A1 * 10/2017 ........... H01L 23/552

* cited by examiner

*Primary Examiner* — Jeremy C Norris
(74) *Attorney, Agent, or Firm* — Patent Capital Group

(57) ABSTRACT

Particular embodiments described herein provide for an electronic device that can be configured to include a sandwich plate construction heatsink. The sandwich plate construction heatsink can include a cold plate, one or more heat pipes over the cold plate, and a top plate over the one or more heat pipes. The cold plate can include a channel to accommodate the one or more heat pipes and/or the top plate can include a channel to accommodate the one or more heat pipes. The cold plate can be over a heat source in the electronic device.

14 Claims, 12 Drawing Sheets

106g
120
122b
124b
126
128
118b
124a
132
104

HEATSINK WITH A SANDWICH PLATE CONSTRUCTION

TECHNICAL FIELD

This disclosure relates in general to the field of computing and/or device cooling, and more particularly, to a heatsink with a sandwich plate construction.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
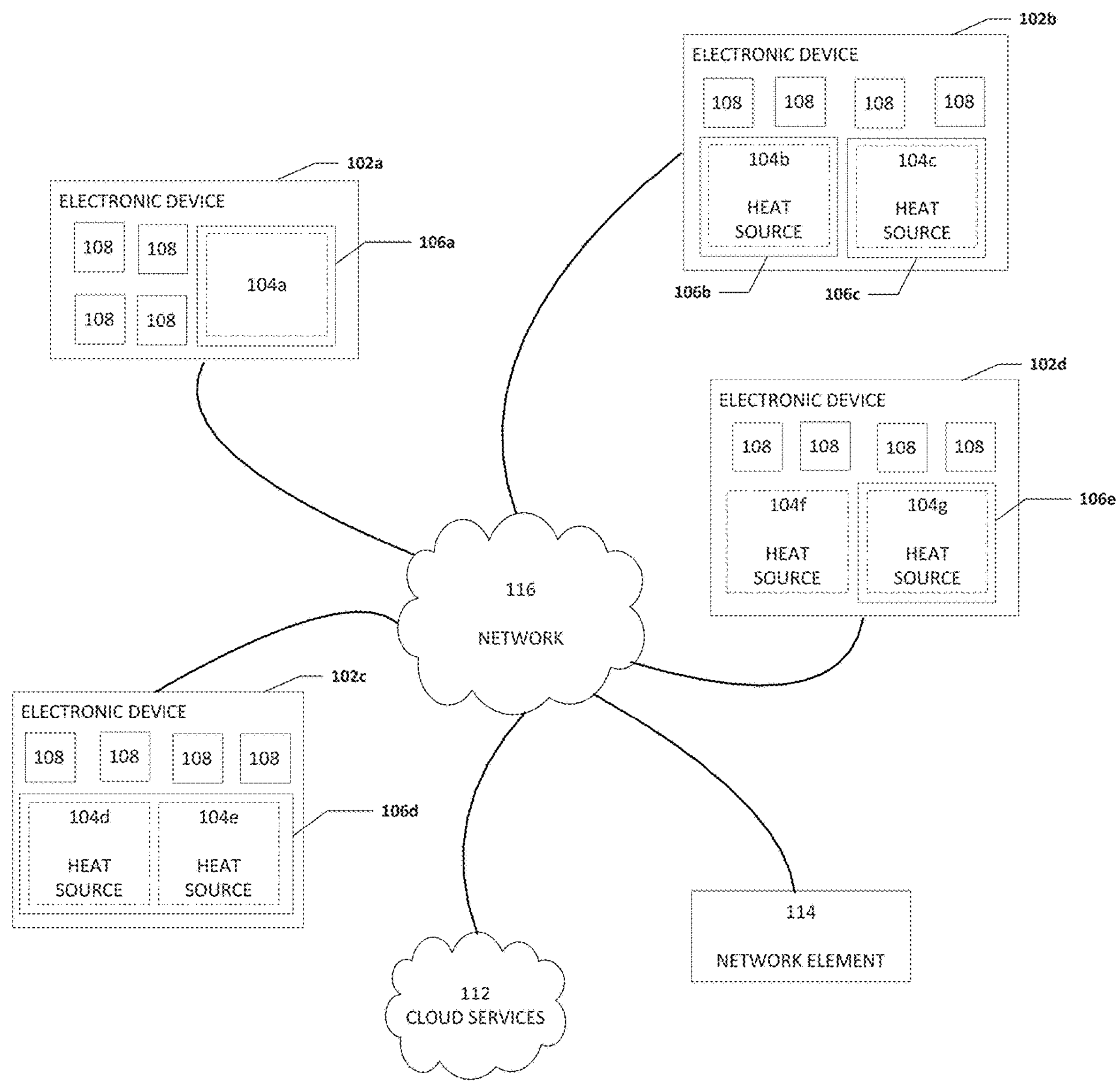
FIG. 1 is a simplified block diagram of electronic devices that include a heatsink with a sandwich plate construction, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a heatsink with a sandwich plate construction. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms “over,” “under,” “below,” “between,” and “on” as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component “directly on” a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

FIG. 1 is a simplified block diagram of electronic devices that include a heatsink with a sandwich plate construction, in accordance with an embodiment of the present disclosure. In an example, an electronic device can include one or more heat sources. Each of the one or more heat sources may have a corresponding heatsink with a sandwich plate construction. For example, as illustrated in FIG. 1, electronic device 102*a* includes heat source 104*a*, a corresponding sandwich plate heatsink 106*a*, and one or more electronics 108. In addition, electronic device 102*b* includes heat sources 104*b* and 104*c*, corresponding sandwich plate heatsinks 106*b* and 106*c* respectively, and one or more electronics 108. Also, electronic device 102*c* includes heat sources 104*d* and 104*e*, and one or more electronics 108. Sandwich plate heatsink 106*d* can correspond to both heat sources 104*d* and 104*e*. Further, electronic device 102*d* includes heat sources 104*f* and 104*g* and one or more electronics 108. Heat source 104*f* may not have a corresponding sandwich plate heatsink and sandwich plate heatsink 106*e* may correspond to heat source 104*g*. Each of electronic devices 102*a*-102*d* may be in communication with each other, cloud services 112, and/or network element 114 using network 116. In some examples, one or more of electronic device 102*a*-102*d* may be standalone devices and not connected to network 116 or another device.

Each of heat sources 104*a*-104*g* may be a heat generating device (e.g., processor, logic unit, field programmable gate array (FPGA), chip set, integrated circuit (IC), a graphics processor, graphics card, battery, memory, or some other type of heat generating device). Each of sandwich plate heatsinks 106*a*-106*e* can be configured as a thermal cooling device to help remove thermal energy from one or more corresponding heat sources (e.g., sandwich plate heatsink 106*a* corresponds to heat source 104*a*, sandwich plate heatsink 106*d* corresponds to both heat sources 104*d* and 104*e*, etc.). Each of sandwich plate heatsinks 106*a*-106*e* may be part of a passive cooling device or an active cooling device to help reduce the thermal energy or temperature of one or more corresponding heat sources. Each of electronics 108 can be a device or group of devices available to assist in the operation or function of the electronic device that includes electronics 108.

In an example, each of sandwich plate heatsinks 106*a*-106*e* can be configured with a sandwich plate construction that includes a structural member placed over the top of one or more heat pipes and attached to the edges of a cold plate and/or a base (e.g., printed circuit board, motherboard, or some other substrate). The sandwich construction of the heatsink locates the heat pipes at the center of the sandwich, where the relatively low stiffness of the heat pipes has the least impact on the overall stiffness of the sandwich plate heatsink. When the sandwich plate heatsink is coupled to a base and over the heat source, the top stiffening plate is loaded primarily in tension, thereby increasing the effective stiffness of the sandwich plate heatsink. The sandwich plate heatsink can be coupled to the base using a retention mechanism. The retention mechanism can be any mechanism, devices, structure, etc. that cause the top stiffening plate to be loaded in tension and increase the effective stiffness of the sandwich plate heatsink. The retention mechanism can be combined and/or integrated with the cold plate and/or the top stiffening plate. The top stiffening plate can help to create a smooth uniform pressure or load profile on the sandwich plate heatsink and the heat source when a load is applied to the sandwich plate heatsink. This can help to decrease or eliminate heatsink loading on the package stiffener, which can help reduce or prevent solder joint failure, and help to prevent or reduce high edge loading on the heat source, which can help reduce or prevent cracking or damaging the heat source. The top stiffening plate can be soldered or otherwise attached to the top of the heat pipes to provide even more stiffness.

In this context, the loading described as "primarily in tension" or "tension element" means that most of the force transferred through the top stiffener plate is both parallel to the top stiffening plate (i.e., in the same plane as the top stiffening plate), and in a direction such that it tends to stretch the top stiffening plate, thereby pulling or increasing the top stiffening plate's length in the direction of the force (albeit by a relatively small amount). This stands in contrast to other common structural loading conditions where a thin plate may not be well-suited (e.g., compression where the loading is in the same plane as the thin plate, but in a direction that tends to reduce the length of the thin plate in the direction of the force, which may cause a thin plate to buckle, and shear or bending where the loading is in a direction that is orthogonal to the plane of the thin plate, which may cause a thin plate to deform in the out-of-plane direction by an unacceptably large amount).

Because the top stiffening plate acts primarily as a tension element and does not need a tight thermal coupling to the rest of the heatsink, many different assembly methods are possible. In some current examples, heat pipes are typically solder attached to a cold plate using a standard low-temperature solder and during this stage in manufacturing, the top stiffening plate could also be soldered to the heat pipe. In another example, the top stiffener plate can be added using a laser welding process or a mechanical fastening or riveting means after the heat pipe has been coupled to the cold plate. Additionally, leaf spring elements could be designed to be part of the retention mechanism for the top stiffening plate, either by including integrated fasteners or other interlocking features that capture the heat pipes between the cold plate and the top stiffening plate.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. Further, the appearances of the phrase "in one example" or "in an example" are not necessarily all referring to the same examples.

Elements of FIG. 1 may be coupled to one another through one or more interfaces employing any suitable connections (wired or wireless), which provide viable pathways for network (e.g., network 116, etc.) communications. Additionally, any one or more of these elements of FIG. 1 may be combined or removed from the architecture based on particular configuration needs. Network 116 may include a configuration capable of transmission control protocol/Internet protocol (TCP/IP) communications for the transmission or reception of packets in a network. Each of electronic devices 102*a*-102*d* may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function while having a relatively thin profile. However, the increase in performance and/or function causes an increase in the thermal challenges of the devices and systems, especially for relatively thin electronic devices.

The drive for improved transient thermal performance and system responsiveness has led to the widespread adoption of multiple heat pipes to try and cool heat sources, especially in cool mobile system-on-chip (SoC) packages in the fifteen (15) watt to sixty-five (65) watt range. In parallel, the use of a package stiffener for warpage control during surface mount has become ubiquitous for bare-die packages. As a result, a heat sink that is designed to generate a relatively high pressure or relatively high load on the thermal interface material (TIM) can inadvertently bend so much that it contacts the system-on-chip (SoC) package stiffener. This presents a thermal performance risk due to decreased TIM pressure, as well as a solder joint reliability risk because packages are typically designed and certified assuming one-hundred percent (100%) of the load is on the die.

To address this issue, some current systems try to impose a maximum allowable stiffener load on thermal solution designs. However, determining a maximum allowable stiffener load can be difficult and time consuming because the maximum allowable stiffener load and distribution must be quantified through extensive testing and modeling and original equipment manufacturers (OEMs) and original design manufacturers (ODMS) must validate their designs against new requirements. Some current systems use a thicker heat sink or reduce the heat sink load to reduce deflection but the thicker heat sink can add to the thickness of the system and the reduced heat sink load can reduce the thermal performance of the heatsink. In some other current systems, a heat sink with a pedestal is used. Heat sinks with pedestals can avoid stiffener contact but are more costly to manufacture and may impact chassis compatibility and re-use (a major concern frequently cited by OEMs/ODMs) because the XY dimensions of SoC packages and their stiffeners vary from generation to generation. Some systems use additional non-critical-to-function solder balls to mitigate solder joint reliability risk. However, using additional non-critical-to-function solder balls to mitigate solder joint reliability risk can have an unacceptable impact on the dimensions of the heat source and therefore is not a good option for most systems.

A device that includes a heatsink with a sandwich plate construction, as outlined in FIG. 1, can resolve these issues (and others). In an example, a sandwich plate heatsink can be created based on a sandwich plate construction and coupled to a heat source. The sandwich plate heatsink observes sandwich plate theory principles that describe the behavior of a beam or plate that consists of three layers; two facesheets and a core. The sandwich plate theory is an extension of the Euler-Bernoulli beam theory (also known as the engineer's beam theory or classical beam theory). The Euler-Bernoulli beam theory is a simplification of the linear theory of elasticity that provides a means of calculating the load-carrying and deflection characteristics of beams. In the sandwich plate heatsink, the core is one or more heat pipes and one facesheet is a heatsink while the other facesheet is a top stiffening plate. The heatsink is coupled to a heat source to help move heat from the heat source to the heat pipe. The heat pipe is configured to carry the heat away from the heat source. The top stiffening plate adds tension or rigidity to the sandwich plate heatsink.

The top stiffening plate can be located on the top of the one or more heat pipe and rigidly attached to the edges of the cold plate or to a base (e.g., a printed circuit board, motherboard, or some other substrate). The sandwich construction of the heatsink locates the heat pipes at the center of the sandwich, where the relatively low stiffness of the heat pipes has the least impact on the overall stiffness of the heatsink. When the sandwich plate heatsink is coupled to the base and over the heat source, the top stiffening plate is loaded primarily in tension, thereby increasing the effective stiffness of the sandwich plate heatsink. The top stiffening plate can help to create a smooth uniform pressure or load profile on the sandwich plate heatsink and the heat source when a load is applied to the sandwich plate heatsink. This can help to decrease or eliminate heatsink loading on the package stiffener and help prevent or reduce high edge loading on the heat source.

The sandwich plate heatsink, and in particular the top stiffening plate, can be created using copper, steel, aluminum, and/or other alloys and materials that can provide the required stiffness and strength. The top stiffener plate can be soldered to the heat pipes and can be coupled to the cold plate, load frame, and/or springs by any number of common attachment methods, such as soldering, riveting, swaging, stitch welding, brazing, etc. The sandwich plate heatsink can be coupled to the base using a retention mechanism. The retention mechanism can be any mechanism, devices, structure, etc. that cause the top stiffening plate to be loaded in tension and increase the effective stiffness of the sandwich plate heatsink. The retention mechanism can be combined and/or integrated with the cold plate and/or the top stiffening plate. The top stiffening plate can help to create a smooth uniform pressure or load profile on the sandwich plate heatsink and the heat source when a load is applied to the sandwich plate heatsink. The sandwich plate heatsink can be used to help eliminate or reduce cold plate contact with the SoC package stiffener in terms of required Z-height instead of simply increasing the cold plate thickness and can help to reduce the risk of solder joint failure. The term "Z height," "Z location," etc. refers to the height along the "Z" axis of an (x, y, z) coordinate axis or cartesian coordinate system. In addition, the sandwich plate heatsink is a relatively efficient means by which to maintain TIM pressure (thereby minimizing TIM resistance) for electronically devices having a relatively thin profile, when compared with simply thickening the cold plate.

Turning to the infrastructure of FIG. 1, network 116 represents a series of points or nodes of interconnected communication paths for receiving and transmitting packets of information. Network 116 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 116, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102*a*-102*d* are meant to encompass a computer, laptop computer, a laptop or electronic notebook, a personal digital assistant (PDA), a cellular telephone, a smartphone, network elements, network appliances, servers, routers, switches, gateways, bridges, load balancers, processors, modules, or any other device, component, element, or object that includes a heat source and has a relatively thin profile. Each of electronic devices 102*a*-120*d* may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102*a*-120*d* may include virtual elements.

In regards to the internal structure, each of electronic devices 102*a*-120*d* can include memory elements for storing information to be used in operations. Each of electronic devices 102*a*-120*d* may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out activities.

Additionally, each of heat sources 104*a*-104*g* may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Figure 2:
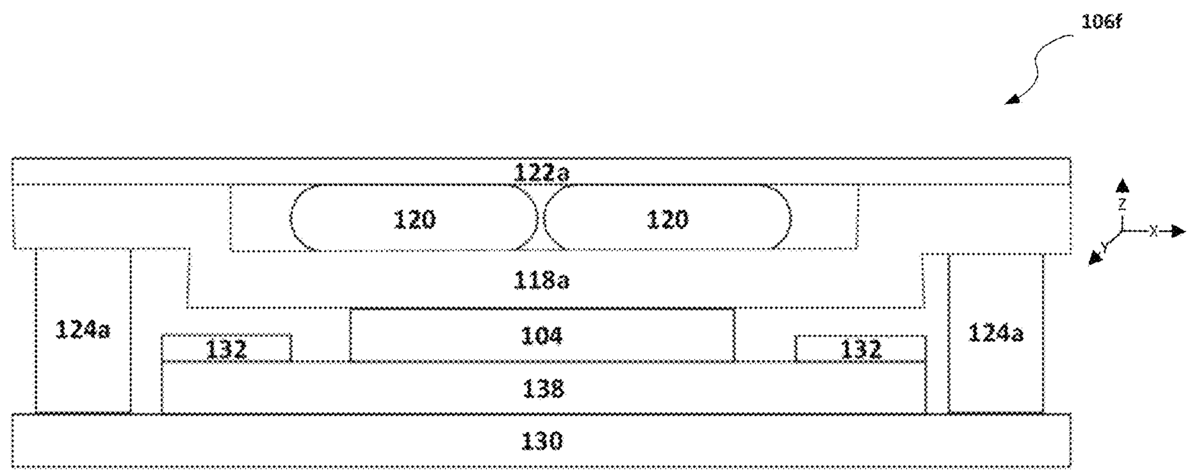
FIG. 2 is a simplified top view block diagram of a portion of a system to enable a heatsink with a sandwich plate construction, in accordance with an embodiment of the present disclosure.

Turning to FIG. 2, FIG. 2 is a simplified block diagram of a sandwich plate heatsink 106*f* over a heat source 104. Sandwich plate heatsink 106*f* can include a cold plate 118*a*, one or more heat pipes 120, and a top plate 122*a*. In some examples, sandwich plate heatsink 106*f* can have a total height (e.g., a total Z-height) of between about 1.3 millimeters to about 3.5 millimeters, between about 1.5 millimeters to about three (3) millimeters, between about two (2) millimeters to about 2.5 millimeters, or some other height based on design considerations and design limitations. The term "Z height" refers to the height along the "Z" axis of an (x, y, z) coordinate axis or cartesian coordinate system.

In an example, a plurality of heat pipes 120 can be over cold plate 118*a*. More specifically, as illustrated in FIG. 2, two (2) heat pipes 120 are illustrated as being over cold plate 118*a*. Heat source 104 and a package stiffener 132 can be on a heat source substrate 138. Heat source substrate 138 can be over base 130. Base 130 may be a printed circuit board, motherboard, or some other substrate. A retention mechanism 124*a* can couple with sandwich plate heatsink 106*f* to help secure top plate 122*a* over one or more heat pipes 120 and create an applied load on cold plate 118*a* over heat source 104. Retention mechanism 124*a* can be any mechanism, devices, structure, etc. that cause top plate 122*a* to be loaded in tension and increase the effective stiffness of sandwich plate heatsink 1061. Top plate 122*a* can help to create a smooth uniform pressure or load profile on sandwich plate heatsink 1061 and heat source 104 when a load is applied to sandwich plate heatsink 1061. This can help to decrease or eliminate undesired heatsink loading on base 130, package stiffener 132, and/or heat source substrate 138, which can help reduce or prevent solder joint failure, and can help prevent or reduce high edge loading on heat source 104, which can help reduce or prevent cracking or damaging heat source 104. In some examples, this can also help to provide for improved performance of heat source 104 by helping to increase the transfer of heat from heat source 104 to heat pipes 120 and away from heat source 104.

Top plate 122*a* can act primarily as a tension element and does not need a tight thermal coupling to cold plate 118*a* or one or more heat pipes 120. In some examples, top plate 122*a* can be soldered to one or more heat pipes 120. In another example, top plate 122*a* can be added using a laser welding process or a mechanical fastening/riveting design after one or more heat pipes 120 have been coupled to cold plate 118*a*.

Figure 3:
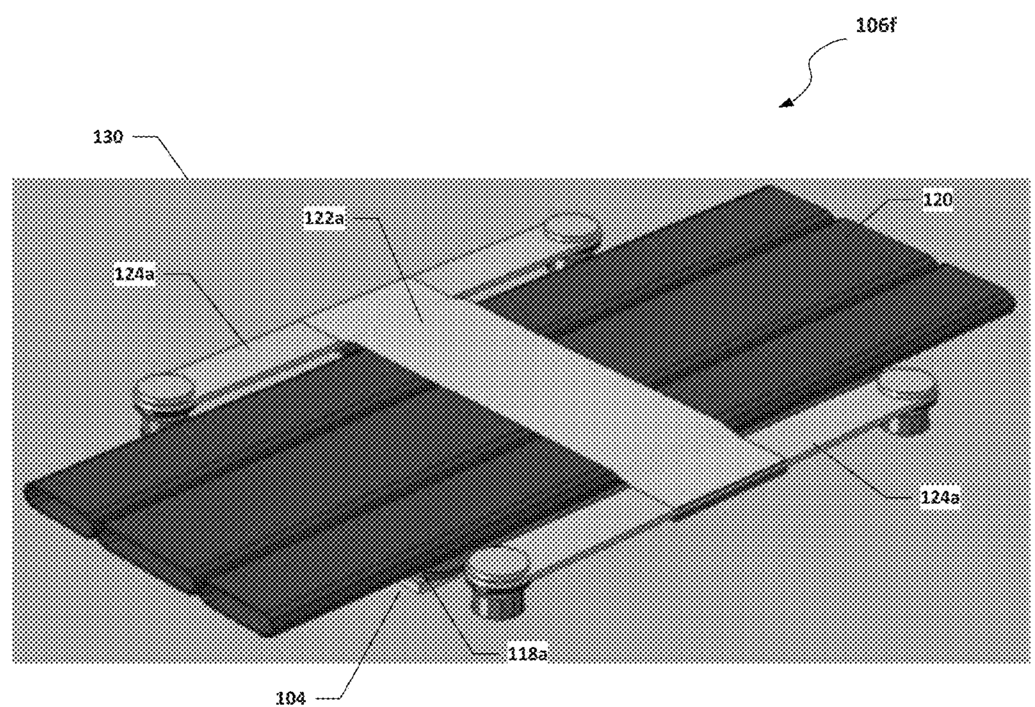
FIG. 3 is a simplified perspective view of a portion of a system to enable a heatsink with a sandwich plate construction, in accordance with an embodiment of the present disclosure.

Turning to FIG. 3, FIG. 3 is a simplified block diagram of sandwich plate heatsink 106*f* over a heat source 104. Sandwich plate heatsink 106*f* can include a cold plate 118*a*, one or more heat pipes 120, and top plate 122*a*. In an example, more than two (2) heat pipes 120 can be over cold plate 118*a*. More specifically, as illustrated in FIG. 3, three (3) heat pipes 120 are illustrated as being over cold plate 118*a*. Heat source 104 can be on base 130. Base 130 may be a printed circuit board, motherboard, or some other substrate. Retention mechanism 124*a* can couple with top plate 122*a* to help secure top plate 122*a* over one or more heat pipes 120 and create an applied load on cold plate 118*a* over heat source 104. Top plate 122*a* can act primarily as a tension element and does not need a tight thermal coupling to cold plate 118*a* or one or more heat pipes 120. In some examples, top plate 122*a* can be soldered to one or more heat pipes 120. In another example, top plate 122*a* can be added using a laser welding process or a mechanical fastening/riveting design after one or more heat pipes 120 have been coupled to cold plate 118*a*.

Figure 4:
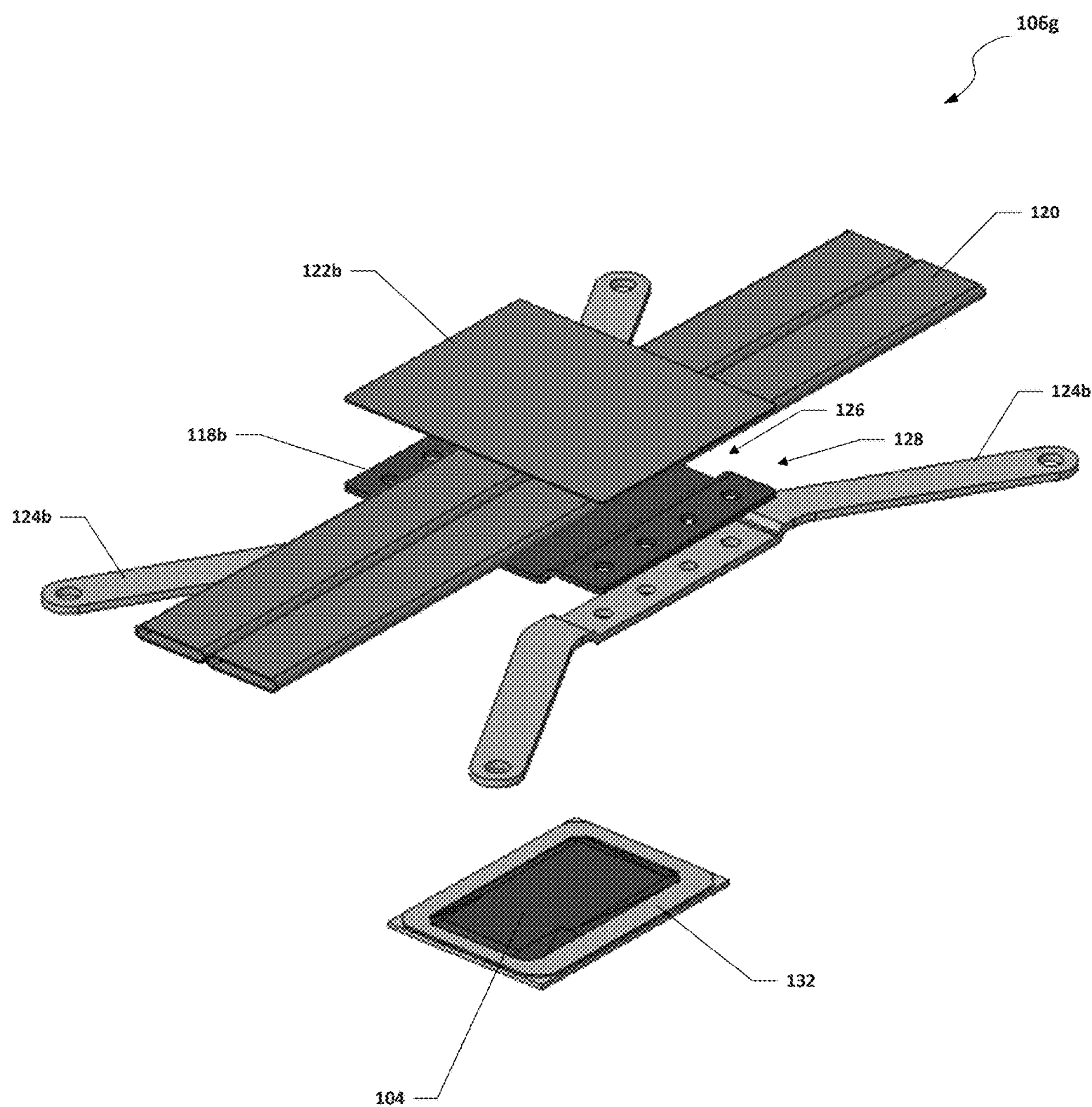
FIG. 4 is a simplified exploded view diagram of a system to enable a heatsink with a sandwich plate construction, in accordance with an embodiment of the present disclosure.

Turning to FIG. 4, FIG. 4 is a simplified exploded block diagram of a sandwich plate heatsink 106*g* over a heat source 104. Sandwich plate heatsink 106*g* can include a cold plate 118*a*, one or more heat pipes 120, and a top plate 122*b*. Cold plate 118*b* can include a channel 126 to accommodate one or more heat pipes 120. Cold plate 118*b* can also include a securing portion 128 to help secure cold plate 118*b* over a heat source 104. Package stiffener 132 can be added for warpage control during surface mount manufacturing. A retention mechanism 124*b* can couple with securing portion 128 on cold plate 118*b* and base 130 (not shown) to help secure cold plate 118*b* over heat source 104. Retention mechanism 124*b* can be any mechanism, devices, structure, etc. that cause top plate 122*b* to be loaded in tension and increase the effective stiffness of sandwich plate heatsink 106*g*. In some examples, retention mechanism 124*b* can include leaf spring elements to help create an applied on cold plate 118*b* over heat source 104.

Top plate 122*b* can act primarily as a tension element and does not need a tight thermal coupling to cold plate 118*b* or one or more heat pipes 120. In some examples, top plate 122*b* can be soldered to one or more heat pipes 120. In another example, top plate 122*b* can be added using a laser welding process or a mechanical fastening/riveting design after one or more heat pipes 120 have been secured in channel 126 of cold plate 118*b*. Because top plate 122*b* acts as a tension element and adds rigidity to sandwich plate heatsink 106*g*, when a load is applied on sandwich plate heatsink 106*g*, sandwich plate heatsink 106*g* does not bend enough to come into contact with package stiffener 132.

Figure 5:
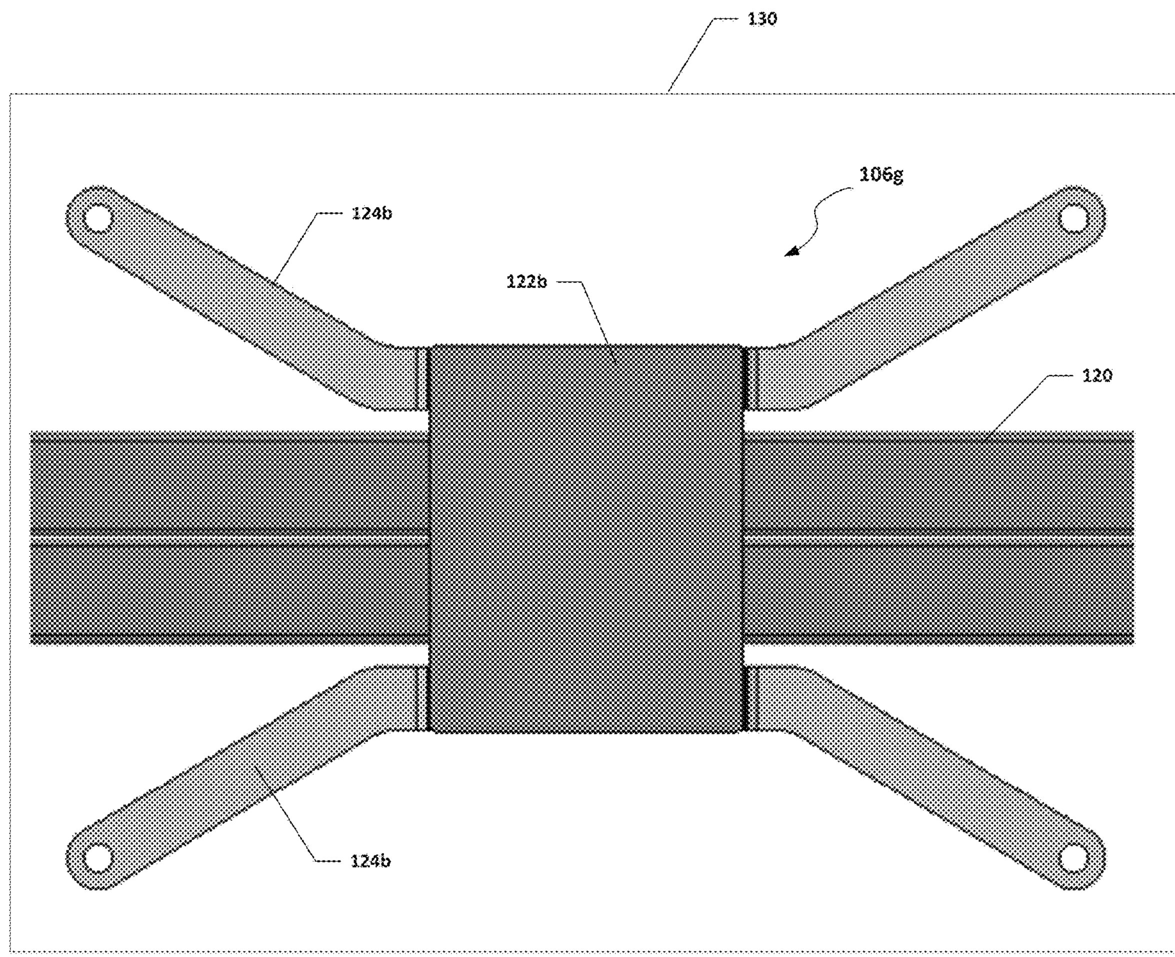
FIG. 5 is a simplified top view block diagram of a portion of a system to enable a heatsink with a sandwich plate construction, in accordance with an embodiment of the present disclosure.

Turning to FIG. 5, FIG. 5 is a simplified top view of a block diagram of sandwich plate heatsink 106*g* coupled to base 130. Sandwich plate heatsink 106*g* can include cold plate 118*b* (not shown), one or more heat pipes 120, and top plate 122*b*. Retention mechanism 124*b* can couple with securing portion 128 on cold plate 118*b* and base 130 to help secure sandwich plate heatsink 106*g* over heat source 104. In some examples, top plate 122*b* can be soldered to one or more heat pipes 120. In another example, top plate 122*b* can be added using a laser welding process or a mechanical fastening/riveting design after one or more heat pipes 120 have been secured in channel 126 of cold plate 118*b*.

Figure 6:
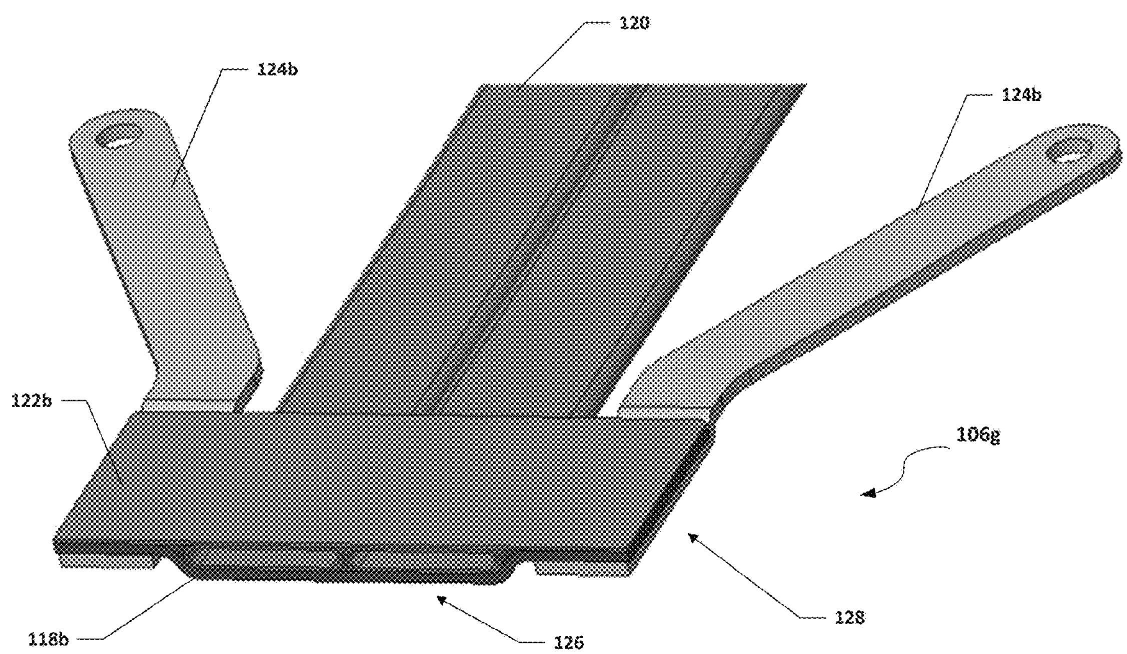
FIG. 6 is a simplified cut away diagram of a portion system to enable a heatsink with a sandwich plate construction, in accordance with an embodiment of the present disclosure.

Turning to FIG. 6, FIG. 6 is a simplified cutaway block diagram perspective view of sandwich plate heatsink 106*g*. Sandwich plate heatsink 106*g* can include cold plate 118*b*, one or more heat pipes 120, and top plate 122*b*. Cold plate 118*b* can include channel 126 to accommodate one or more heat pipes 120. Cold plate 118*b* can also include securing portion 128 to help secure cold plate 118*b* over a heat source (e.g., heat source 104, not shown). Retention mechanism 124*b* can couple with securing portion 128 on cold plate 118*b* and base 130 (not shown) to help secure cold plate 118*b* over the heat source.

Top plate 122*b* can act primarily as a tension element and does not need a tight thermal coupling to cold plate 118*b* or one or more heat pipes 120. In some examples, top plate 122*b* can be soldered to one or more heat pipes 120. In another example, top plate 122*b* can be added using a laser welding process or a mechanical fastening/riveting design after one or more heat pipes 120 have been secured in channel 126 of cold plate 118*b*. Because top plate 122*b* acts as a tension element and adds rigidity to sandwich plate heatsink 106*g*, when a load is applied on sandwich plate heatsink 106*g*, sandwich plate heatsink 106*g* does not bend enough to come into contact with package stiffener 132 (illustrated in FIG. 4).

Figure 7:
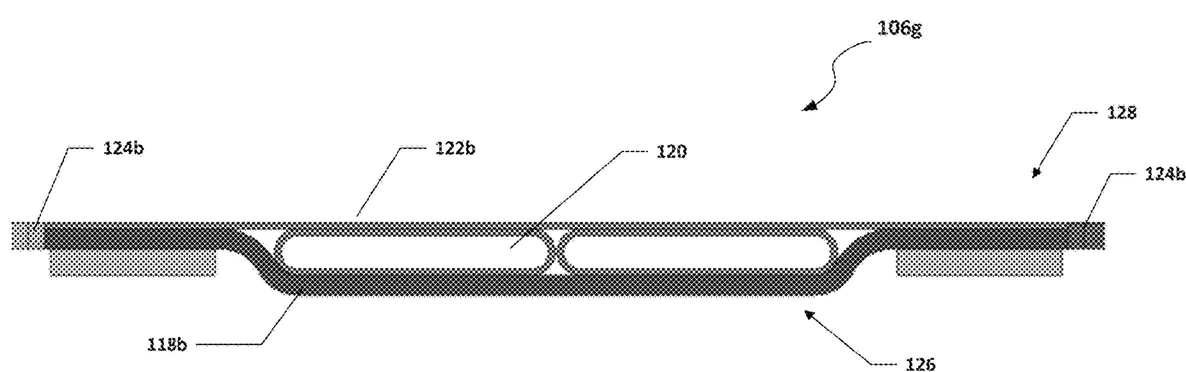
FIG. 7 is a simplified cut away block diagram of a portion of a system to enable a heatsink with a sandwich plate construction, in accordance with an embodiment of the present disclosure.

Turning to FIG. 7, FIG. 7 is a simplified cutaway block diagram side view of sandwich plate heatsink 106*g*. Sandwich plate heatsink 106*g* can include cold plate 118*b*, one or more heat pipes 120, and top plate 122*b*. Cold plate 118*b* can include channel 126 to accommodate one or more heat pipes 120. Cold plate 118*b* can also include securing portion 128 to help secure cold plate 118*b* over a heat source (e.g., heat source 104, not shown). Retention mechanism 124*b* can couple with securing portion 128 on cold plate 118*b* and base 130 (not shown) to help secure cold plate 118*b* over the heat source.

Top plate 122*b* can act primarily as a tension element and does not need a tight thermal coupling to cold plate 118*b* or one or more heat pipes 120. In some examples, top plate 122*b* can be soldered to one or more heat pipes 120. In another example, top plate 122*b* can be added using a laser welding process or a mechanical fastening/riveting design after one or more heat pipes 120 have been secured in channel 126 of cold plate 118*b*. Because top plate 122*b* acts as a tension element and adds rigidity to sandwich plate heatsink 106*g*, when a load is applied on sandwich plate heatsink 106*g*, sandwich plate heatsink 106*g* does not bend enough to come into contact with package stiffener 132 (illustrated in FIG. 4).

Figure 8:
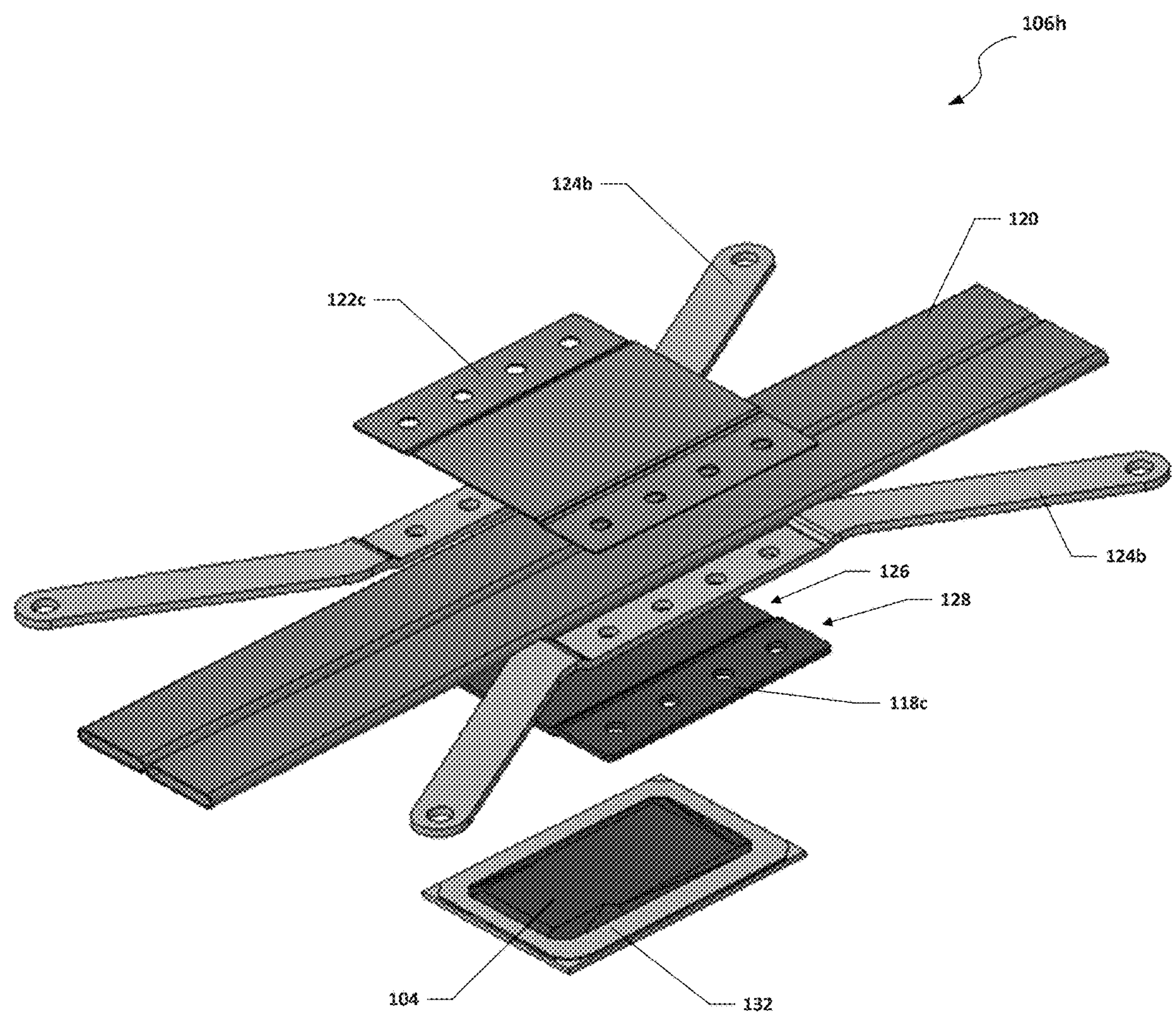
FIG. 8 is a simplified exploded view diagram of a system to enable a heatsink with a sandwich plate construction, in accordance with an embodiment of the present disclosure.

Turning to FIG. 8, FIG. 8 is a simplified exploded block diagram of a sandwich plate heatsink 106*h* over a heat source 104. Sandwich plate heatsink 106*h* can include a cold plate 118*c*, one or more heat pipes 120, and a top plate 122*c*. Cold plate 118*c* can include a channel 126 to accommodate one or more heat pipes 120. Cold plate 118*c* can also include a securing portion 128 to help secure cold plate 118*c* over a heat source 104 and top plate 122*c* to cold plate 118*c*. Package stiffener 132 can be added for warpage control during surface mount manufacturing. Retention mechanism 124*b* can couple with securing portion 128 on cold plate 118*c* and base 130 (not shown) to help secure cold plate 118*c* over heat source 104. Top plate 122*c* can be secured to retention mechanism 124*b*.

Top plate 122*c* can act primarily as a tension element and does not need a tight thermal coupling to cold plate 118*c* or one or more heat pipes 120. In some examples, top plate 122*c* can be soldered to one or more heat pipes 120. In another example, top plate 122*c* can be added using a laser welding process or a mechanical fastening/riveting design after one or more heat pipes 120 have been secured in channel 126 of cold plate 118*c*. Additionally, top plate 122*c* can be secured to retention mechanism 124*b* and leaf spring elements could be designed to be part of retention mechanism 124*b* to help create an applied on cold plate 118*c* over heat source 104. Because top plate 122*c* acts as a tension element and adds rigidity to sandwich plate heatsink 106*h*, when a load is applied on sandwich plate heatsink 106*h*, sandwich plate heatsink 106*h* does not bend enough to come into contact with package stiffener 132.

Figure 9:
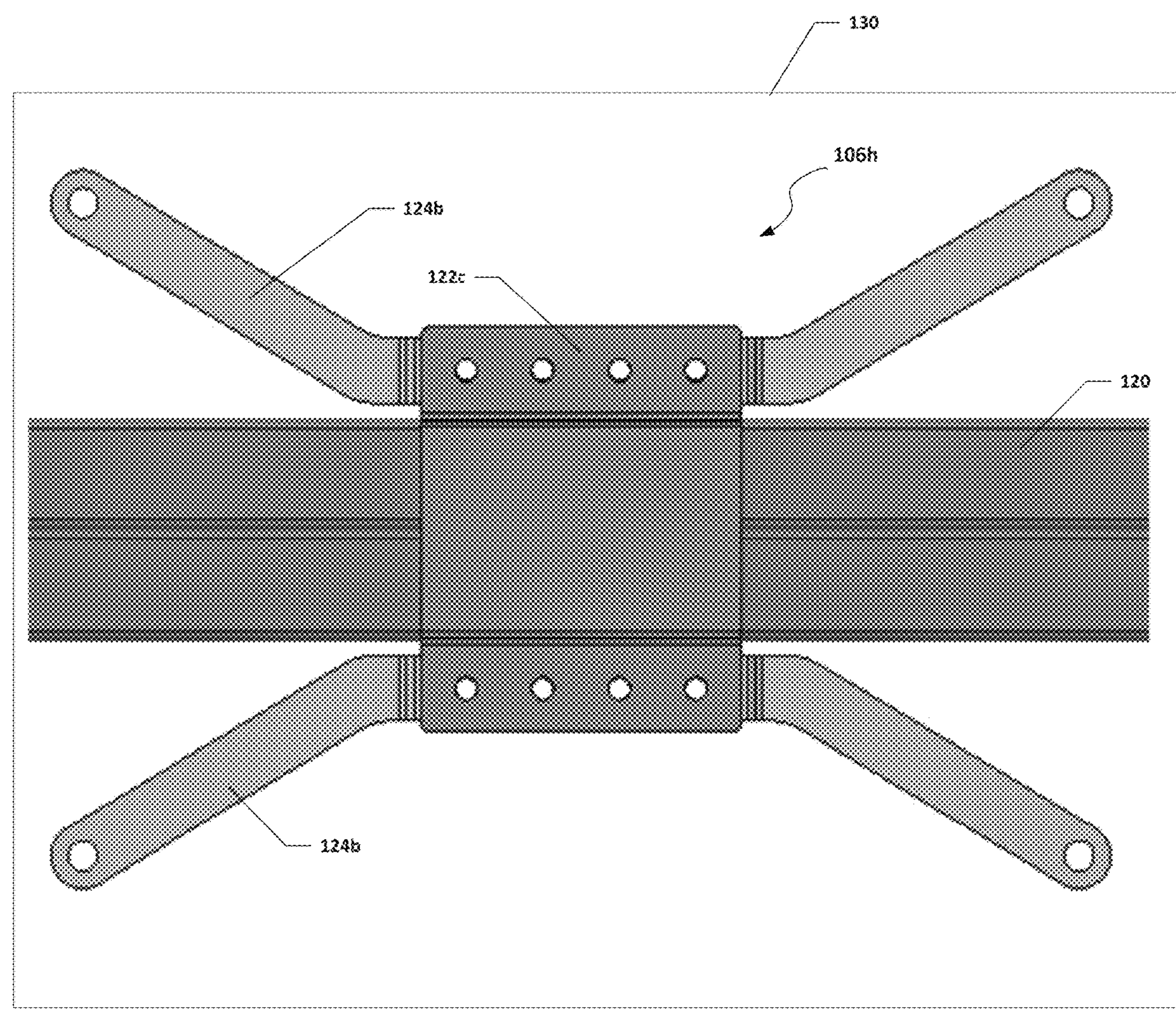
FIG. 9 is a simplified top view block diagram of a portion of a system to enable a heatsink with a sandwich plate construction, in accordance with an embodiment of the present disclosure.

Turning to FIG. 9, FIG. 9 is a simplified top view of a block diagram of sandwich plate heatsink 106*h* coupled to base 130. Sandwich plate heatsink 106*h* can include cold plate 118*c* (not shown), one or more heat pipes 120, and top plate 122*c*. Top plate 122*c* can be coupled to retention mechanism 124*b* coupled with securing portion 128 on cold plate 118*c* and base 130 to help secure sandwich plate heatsink 106*h* over heat source 104. In some examples, top plate 122*c* can be soldered to one or more heat pipes 120. In another example, top plate 122*c* can be added using a laser welding process or a mechanical fastening/riveting design after one or more heat pipes 120 have been secured in channel 126 of cold plate 118*c*. Additionally, top plate 122*c* can be secured to retention mechanism 124*b*.

Figure 10:
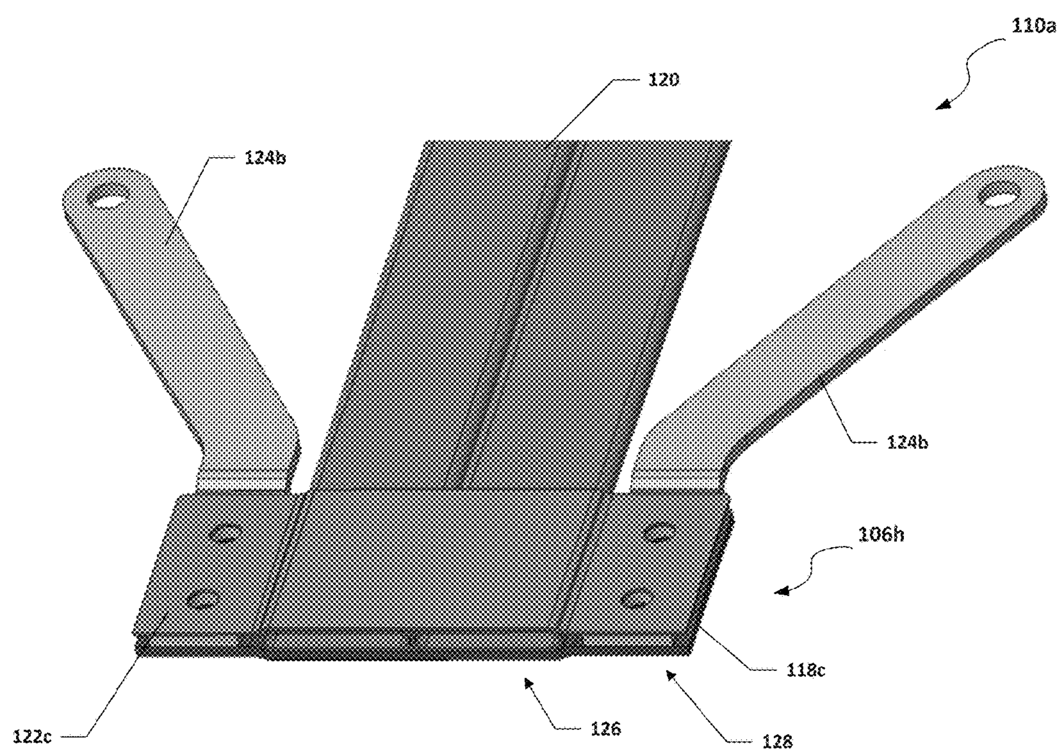
FIG. 10 is a simplified cut away diagram of a portion system to enable a heatsink with a sandwich plate construction, in accordance with an embodiment of the present disclosure.

Turning to FIG. 10, FIG. 10 is a simplified cutaway block diagram perspective view of sandwich plate heatsink 106*h*. Sandwich plate heatsink 106*h* can include cold plate 118*c*, one or more heat pipes 120, and top plate 122*c*. Cold plate 118*c* can include channel 126 to accommodate one or more heat pipes 120. Cold plate 118*c* can also include securing portion 128 to help secure cold plate 118*c* over a heat source (e.g., heat source 104, not shown) and top plate 122*c* to cold plate 118*c*. Retention mechanism 124*b* can couple with securing portion 128 on cold plate 118*c* and base 130 (not shown) to help secure cold plate 118*c* over the heat source.

Top plate 122*c* can act primarily as a tension element and does not need a tight thermal coupling to cold plate 118*c* or one or more heat pipes 120. In some examples, top plate 122*c* can be soldered to one or more heat pipes 120. In another example, top plate 122*c* can be added using a laser welding process or a mechanical fastening/riveting design after one or more heat pipes 120 have been secured in channel 126 of cold plate 118*c*. Additionally, top plate 122*c* can be secured to retention mechanism 124*b*. Because top plate 122*c* acts as a tension element and adds rigidity to sandwich plate heatsink 106*h*, when a load is applied on sandwich plate heatsink 106*h*, sandwich plate heatsink 106*h* does not bend enough to come into contact with package stiffener 132 (illustrated in FIG. 8).

Figure 11:
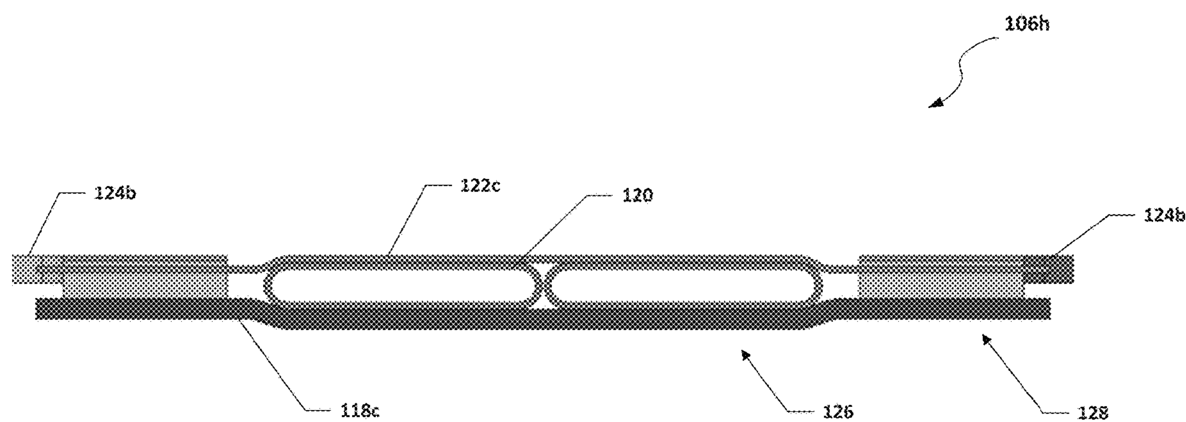
FIG. 11 is a simplified cut away block diagram of a portion of a system to enable a heatsink with a sandwich plate construction, in accordance with an embodiment of the present disclosure.

Turning to FIG. 11, FIG. 11 is a simplified cutaway block diagram side view of sandwich plate heatsink 106*h*. Sandwich plate heatsink 106*h* can include cold plate 118*c*, one or more heat pipes 120, and top plate 122*c*. Cold plate 118*c* can include channel 126 to accommodate one or more heat pipes 120. Cold plate 118*c* can also include securing portion 128 to help secure cold plate 118*c* over a heat source (e.g., heat source 104, not shown) and top plate 122*c* to cold plate 118*c*. Retention mechanism 124*b* can couple with securing portion 128 on cold plate 118*c* and base 130 (not shown) to help secure cold plate 118*c* over the heat source.

Top plate 122*c* can act primarily as a tension element and does not need a tight thermal coupling to cold plate 118*c* or one or more heat pipes 120. In some examples, top plate 122*c* can be soldered to one or more heat pipes 120. In another example, top plate 122*c* can be added using a laser welding process or a mechanical fastening/riveting design after one or more heat pipes 120 have been secured in channel 126 of cold plate 118*c*. Additionally, top plate 122*c* can be secured to retention mechanism 124*b*. Because top plate 122*c* acts as a tension element and adds rigidity to sandwich plate heatsink 106*h*, when a load is applied on sandwich plate heatsink 106*h*, sandwich plate heatsink 106*h* does not bend enough to come into contact with package stiffener 132 (illustrated in FIG. 8).

Figure 12:
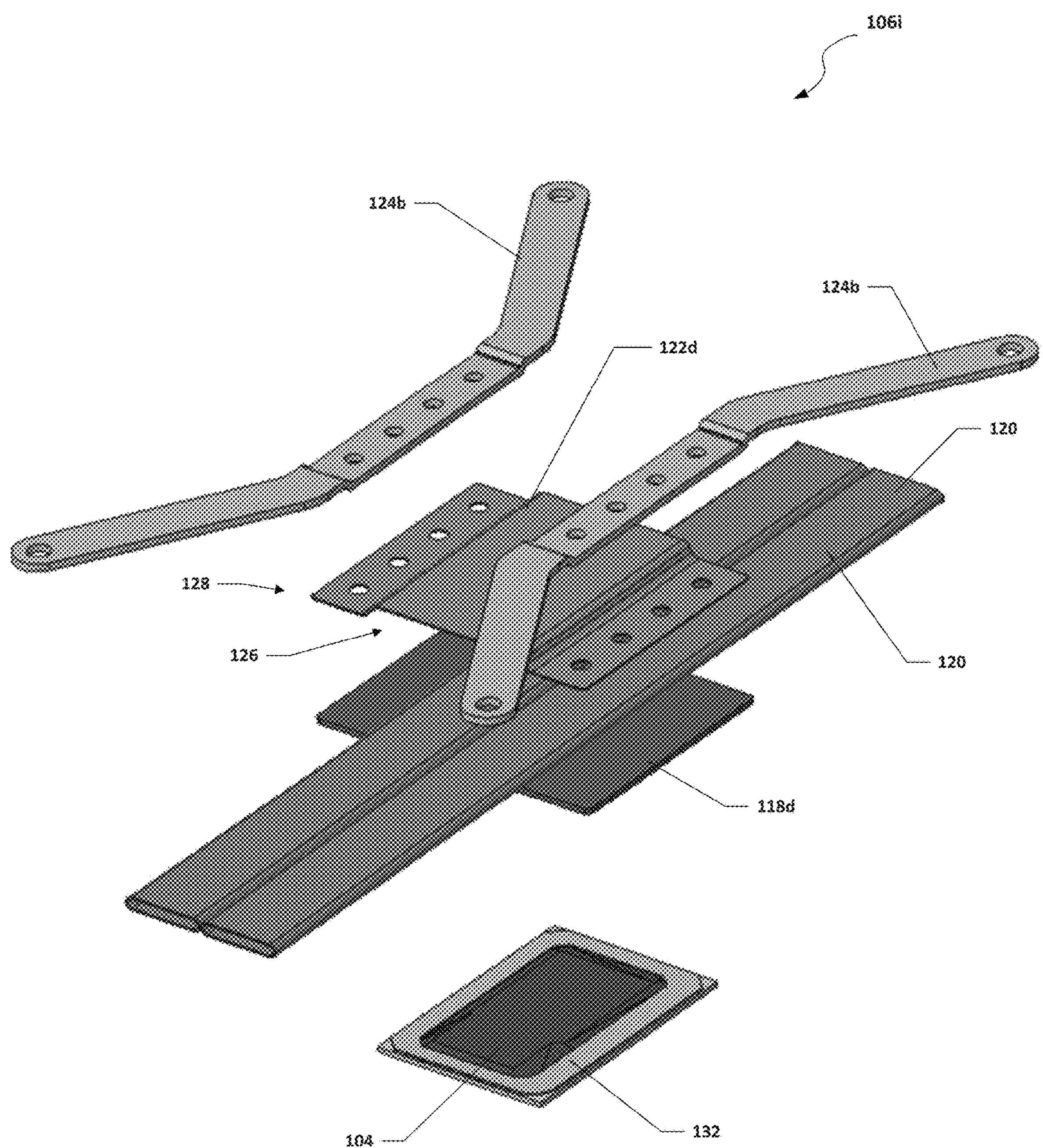
FIG. 12 is a simplified exploded view diagram of a system to enable a heatsink with a sandwich plate construction, in accordance with an embodiment of the present disclosure.

Turning to FIG. 12, FIG. 12 is a simplified exploded block diagram of a sandwich plate heatsink 106*i* over a heat source 104. Sandwich plate heatsink 106*i* can include a cold plate 118*d*, one or more heat pipes 120, and a top plate 122*d*. Cold plate 118*b* can be relatively flat. Top plate 122*d* can include a top plate channel 134 to accommodate one or more heat pipes 120. Top plate 122*d* can also include a top plate securing portion 136 to help secure cold plate 118*d* over a heat source 104 and top plate 122*d* to base 130 (not shown).

Package stiffener 132 can be added for warpage control during surface mount manufacturing. Retention mechanism 124*b* can couple with top plate securing portion 136 on top plate 122*d* and base 130 (not shown) to help secure cold plate 118*d* over heat source 104.

Top plate 122*d* can act primarily as a tension element and does not need a tight thermal coupling to cold plate 118*d* or one or more heat pipes 120. In some examples, top plate 122*d* can be soldered to one or more heat pipes 120. In another example, top plate 122*d* can be added using a laser welding process or a mechanical fastening/riveting design after one or more heat pipes 120 have been secured in channel 126 of cold plate 118*d*. Additionally, top plate 122*d* can be secured to retention mechanism 124*b* and leaf spring elements could be designed to be part of retention mechanism 124*b* to help create an applied on cold plate 118*d* over heat source 104. Because top plate 122*d* acts as a tension element and adds rigidity to sandwich plate heatsink 106*i*, when a load is applied on sandwich plate heatsink 106*i*, sandwich plate heatsink 106*i* does not bend enough to come into contact with package stiffener 132.

Figure 13:
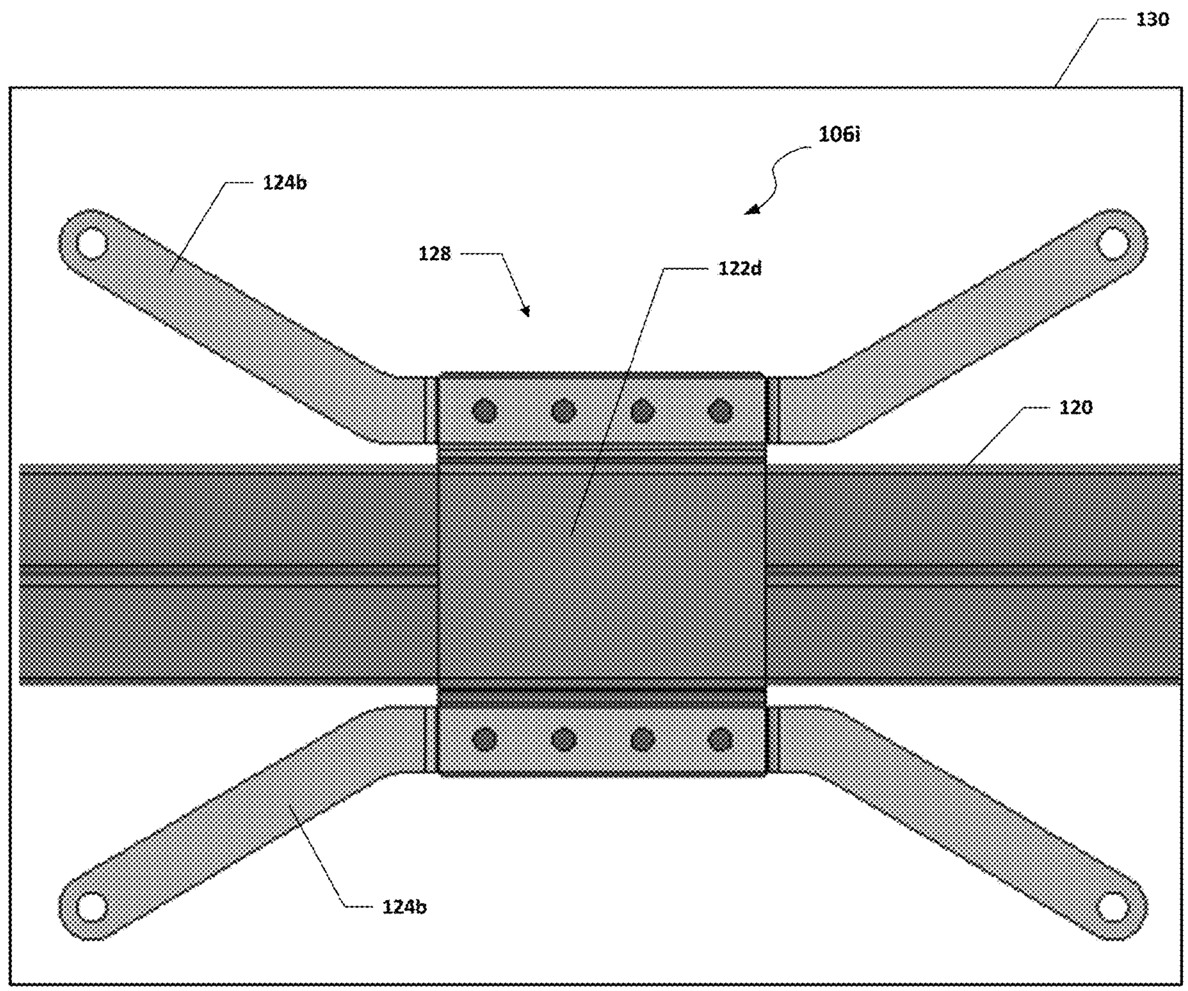
FIG. 13 is a simplified top view block diagram of a portion of a system to enable a heatsink with a sandwich plate construction, in accordance with an embodiment of the present disclosure.

Turning to FIG. 13, FIG. 13 is a simplified top view of a block diagram of sandwich plate heatsink 106*i* coupled to base 130. Sandwich plate heatsink 106*i* can include cold plate 118*d* (not shown), one or more heat pipes 120, and top plate 122*d*. Top plate 122*d* can include a top plate channel 134 (not shown) to accommodate one or more heat pipes 120. Top plate 122*d* can also include a top plate securing portion 136 to help secure cold plate 118*d* over a heat source 104 and top plate 122*d* to base 130 to help secure sandwich plate heatsink 106*i* over heat source 104. In some examples, top plate 122*d* can be soldered to one or more heat pipes 120. In another example, top plate 122*d* can be added using a laser welding process or a mechanical fastening/riveting design after one or more heat pipes 120 have been secured in channel 126 of cold plate 118*d*. Additionally, top plate 122*d* can be secured to retention mechanism 124*b*.

Figure 14:
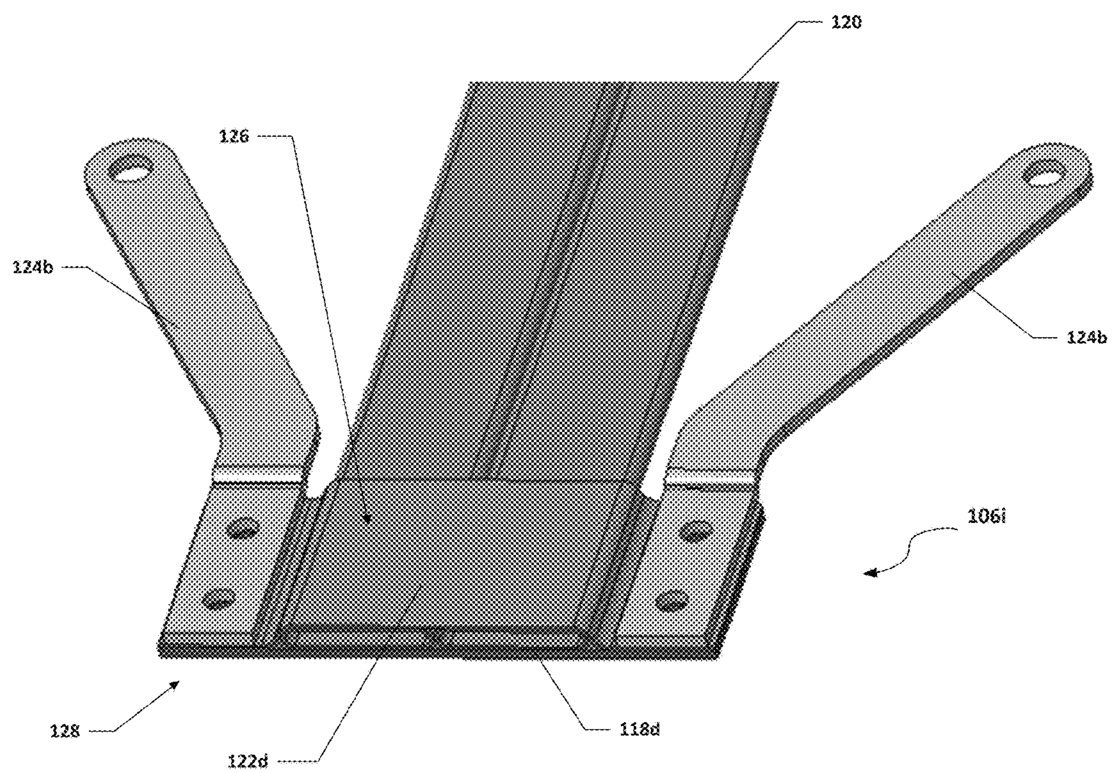
FIG. 14 is a simplified cut away diagram of a portion system to enable a heatsink with a sandwich plate construction, in accordance with an embodiment of the present disclosure.

Turning to FIG. 14, FIG. 14 is a simplified cutaway block diagram perspective view of sandwich plate heatsink 106*i*. Sandwich plate heatsink 106*i* can include cold plate 118*d*, one or more heat pipes 120, and top plate 122*d*. Top plate 122*d* can include top plate channel 134 to accommodate one or more heat pipes 120. Top plate 122*d* can also include top plate securing portion 136 to help secure cold plate 118*d* over heat source (e.g., heat source 104, not shown) and top plate 122*d* to base 130 (not shown).

Top plate 122*d* can act primarily as a tension element and does not need a tight thermal coupling to cold plate 118*d* or one or more heat pipes 120. In some examples, top plate 122*d* can be soldered to one or more heat pipes 120. In another example, top plate 122*d* can be added using a laser welding process or a mechanical fastening/riveting design after one or more heat pipes 120 have been secured in channel 126 of cold plate 118*d*. Additionally, top plate 122*d* can be secured to retention mechanism 124*b*. Because top plate 122*d* acts as a tension element and adds rigidity to sandwich plate heatsink 106*i*, when a load is applied on sandwich plate heatsink 106*i*, sandwich plate heatsink 106*i* does not bend enough to come into contact with package stiffener 132 (illustrated in FIG. 12).

Figure 15:
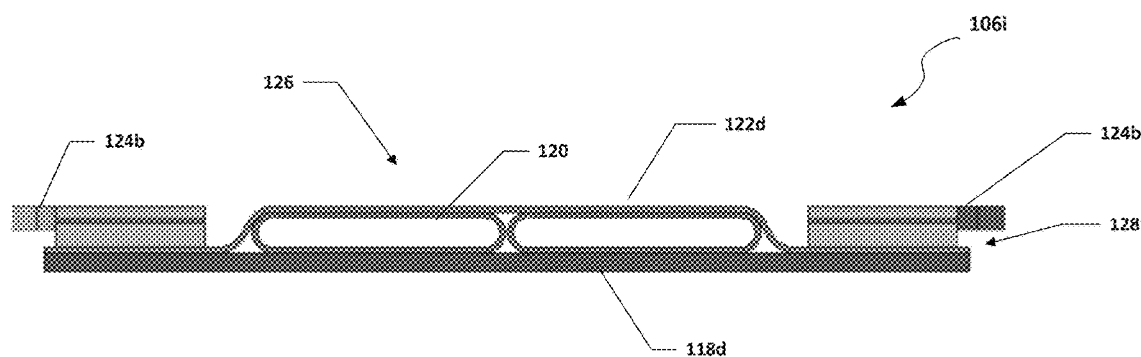
FIG. 15 is a simplified cut away block diagram of a portion of a system to enable a heatsink with a sandwich plate construction, in accordance with an embodiment of the present disclosure.

Turning to FIG. 15, FIG. 15 is a simplified cutaway block diagram side view of sandwich plate heatsink 106*i*. Sandwich plate heatsink 106*i* can include cold plate 118*d*, one or more heat pipes 120, and top plate 122*d*. Top plate 122*d* can include top plate channel 134 to accommodate one or more heat pipes 120. Top plate 122*d* can also include top plate securing portion 136 to help secure cold plate 118*d* over heat source (e.g., heat source 104, not shown) and top plate 122*d* to base 130 (not shown).

Top plate 122*d* can act primarily as a tension element and does not need a tight thermal coupling to cold plate 118*d* or one or more heat pipes 120. In some examples, top plate 122*d* can be soldered to one or more heat pipes 120. In another example, top plate 122*d* can be added using a laser welding process or a mechanical fastening/riveting design after one or more heat pipes 120 have been secured in channel 126 of cold plate 118*d*. Additionally, top plate 122*d* can be secured to retention mechanism 124*b*. Because top plate 122*d* acts as a tension element and adds rigidity to sandwich plate heatsink 106*i*, when a load is applied on sandwich plate heatsink 106*i*, sandwich plate heatsink 106*i* does not bend enough to come into contact with package stiffener 132 (illustrated in FIG. 12).

Figure 16:
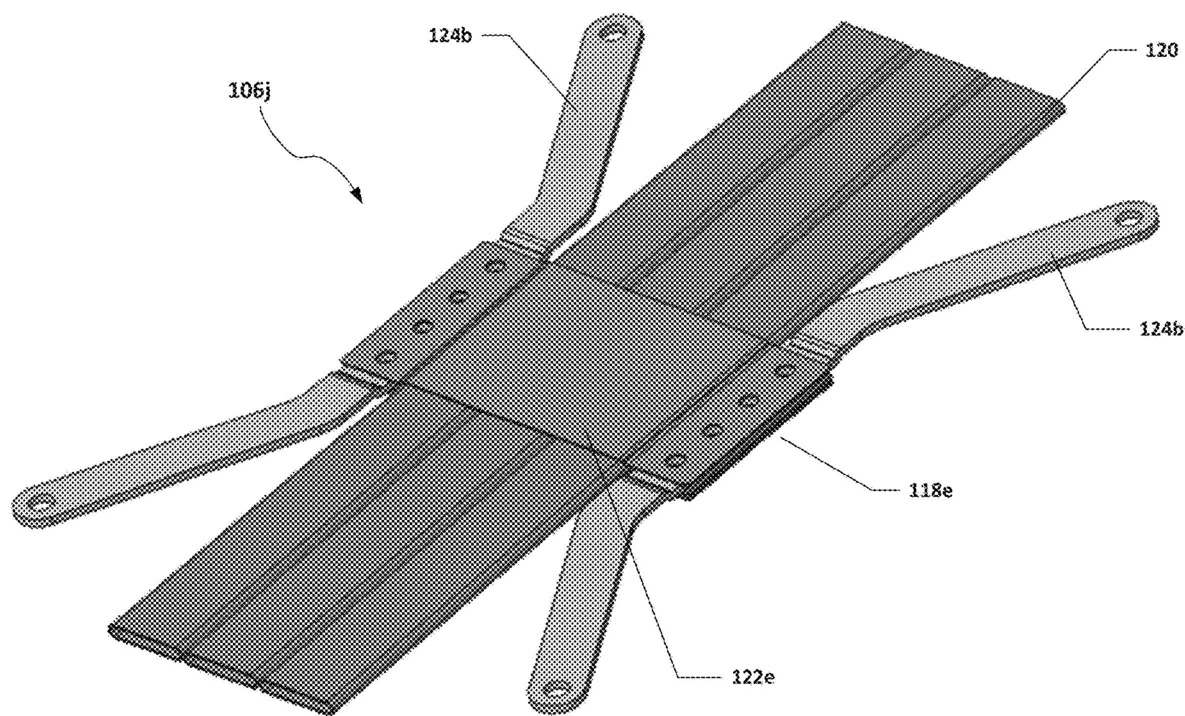
FIG. 16 is a simplified perspective view of a system to enable a heatsink with a sandwich plate construction, in accordance with an embodiment of the present disclosure.

Turning to FIG. 16, FIG. 16 is a simplified block diagram of a sandwich plate heatsink 106*j*. Sandwich plate heatsink 106*j* can include a cold plate 118*e*, one or more heat pipes 120, and a top plate 122*e*. As illustrated in FIG. 16, three heat pipes are shown, however, sandwich plate heatsink 106*j* can accommodate more or fewer heat pipes depending on design choice. In an example, cold plate 118*e* can include a channel to accommodate one or more heat pipes 120 (e.g., as illustrated in FIGS. 6, 8, and 9, cold plate 118*b* can include channel 126 to accommodate one or more heat pipes 120). In another example, top plate 122*e* can include a channel to accommodate one or more heat pipes 120 (e.g., as illustrate in FIGS. 10, 12, and 13, top plate 122*c* can include a top plate channel 134 to accommodate one or more heat pipes 120). In some examples, both cold plate 118*e* and top plate 122*e* can include a channel to accommodate one or more heat pipes 120.

In an example, cold plate 118*e* can include a securing portion (e.g., securing portion 128 illustrated in FIGS. 6, 8, and 9). Retention mechanism 124*b* can couple with the securing portion on cold plate 118*e* to help secure cold plate 118*e* over the heat source (not shown) (e.g., as illustrated in FIGS. 6, 8, and 9, retention mechanism 124*b* can couple with securing portion 128 on cold plate 118*b* and base 130 (not shown) to help secure cold plate 118*b* over heat source 104). In another example, top plate 122*e* can include a securing portion (e.g., top plate securing portion 136 illustrated in FIGS. 10, 12, and 13). Retention mechanism 124*b* can be coupled with a top plate securing portion to help secure top plate 122*e* over cold plate 118*e* and cold plate 118*e* over the heat source (not shown) (e.g., as illustrated in FIGS. 10, 12, and 13, top plate 122*c* can include top plate securing portion 136 to help secure top plate 122*d* over cold plate 118*d* and cold plate 118*d* over the heat source). In some examples, cold plate 118*e* can include a securing portion and top plate 122*e* can include a top plate securing portion to help secure cold plate over the heat source.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102*a*-102*d*, sandwich plate heatsinks 106*a*-106*j*, and retention mechanisms 124*a* and 124*b* have been illustrated with reference to particular elements, structure, and/or configurations, these elements may be replaced by any suitable architecture, structure, and/or configurations that achieve the intended functionality of electronic devices 102*a*-102*d* sandwich plate heatsinks 106*a*-106*j*, and retention mechanisms 124*a* and 124*b*.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, a sandwich plate construction heatsink can include a cold plate, one or more heat pipes over the cold plate, and a top plate over the one or more heat pipes.

In Example A2, the subject matter of Example A1 can optionally include where the cold plate includes a channel to accommodate the one or more heat pipes.

In Example A3, the subject matter of any one of Examples A1-A2 can optionally include where the top plate includes a channel to accommodate the one or more heat pipes.

In Example A4, the subject matter of any one of Examples A1-A3 can optionally include a retention mechanism to help secure the sandwich plate construction heatsink over a heat source, where the retention mechanism creates an applied load by the sandwich plate construction heatsink onto a heat source.

In Example A5, the subject matter of any one of Examples A1-A4 can optionally include where the retention mechanism is coupled with the cold plate and a base to help secure the cold plate over the heat source.

In Example A6, the subject matter of any one of Examples A1-A5 can optionally include where the retention mechanism is coupled with the top plate and a base to help secure the cold plate over the heat source.

In Example A7, the subject matter of any one of Examples A1-A6 can optionally include where the sandwich plate construction heatsink is located in a laptop computer.

Example AA1 is an electronic device includes a printed circuit board, a heat source located on the printed circuit board, and a sandwich plate heatsink over the heat source. The sandwich plate heatsink includes a cold plate over the heat source, one or more heat pipes over the cold plate, and a top plate over the one or more heat pipes.

In Example AA2, the subject matter of Example AA1 can optionally include where the cold plate includes a channel to accommodate the one or more heat pipes.

In Example AA3, the subject matter of any one of Examples AA1-AA2 can optionally include where the top plate includes a channel to accommodate the one or more heat pipes.

In Example AA4, the subject matter of any one of Examples AA1-AA3 can optionally include a retention mechanism to help secure the sandwich plate heatsink to the printed circuit board.

In Example AA5, the subject matter of any one of Examples AA1-AA4 can optionally include where the retention mechanism is coupled to the cold plate.

In Example AA6, the subject matter of any one of Examples AA1-AA5 can optionally include where the retention mechanism is coupled to the top plate.

In Example AA7, the subject matter of any one of Examples AA1-AA6 can optionally include a package stiffener around the heat source, where when a load is applied on the sandwich plate heatsink, the sandwich plate heatsink does not come into contact with the package stiffener.

Example AAA1 is an electronic device including a printed circuit board, a heat source located on the printed circuit board, a package stiffener around the heat source, and a sandwich plate construction heatsink over the heat source. The sandwich plate construction heatsink includes a cold plate over the heat source, a plurality of heat pipes over the cold plate, and a top plate over the plurality of heat pipes.

In Example AAA2, the subject matter of Example AAA1 can optionally include where the cold plate includes a channel to accommodate the plurality of heat pipes.

In Example AAA3, the subject matter of any one of Examples AAA1-AAA2 can optionally include where the top plate includes a channel to accommodate the plurality of heat pipes.

In Example AAA4, the subject matter of any one of Examples AAA1-AAA3 can optionally include a retention mechanism to help secure the sandwich plate construction heatsink to the printed circuit board.

In Example AAA5, the subject matter of any one of Examples AAA1-AAA4 can optionally include where the retention mechanism is coupled to the cold plate.

In Example AAA6, the subject matter of any one of Examples AAA1-AAA5 can optionally include where the retention mechanism is coupled to the top plate.

What is claimed is:

1. A sandwich plate construction heatsink over a heat source on a printed circuit board, the sandwich plate construction heatsink comprising:

a cold plate coupled to a retention mechanism that includes leaf spring elements coupled to the printed circuit board;

one or more heat pipes over the cold plate; and a top plate over the one or more heat pipes, wherein the top plate is coupled to the retention mechanism to secure the top plate over the one or more heat pipes, wherein the leaf spring elements of the retention mechanism create an applied load on the cold plate.

2. The sandwich plate construction heatsink of claim 1, wherein the cold plate includes a channel to accommodate the one or more heat pipes.

3. The sandwich plate construction heatsink of claim 1, wherein the top plate includes a channel to accommodate the one or more heat pipes.

4. The sandwich plate construction heatsink of claim 1, wherein the sandwich plate construction heatsink is located in a laptop computer.

5. The sandwich plate construction heatsink of claim 1, wherein the applied load on the cold plate is in a direction towards the printed circuit board.

6. The sandwich plate construction heatsink of claim 1, wherein the retention mechanism does not extend over the one or more heat pipes.

7. The sandwich plate construction heatsink of claim 1, wherein the leaf spring elements are physically separate from each other.

8. An electronic device comprising:

a printed circuit board;

a heat source located on the printed circuit board; and a sandwich plate heatsink over the heat source, wherein the sandwich plate heatsink includes:

a cold plate over the heat source, wherein the cold plate is coupled to a retention mechanism that includes leaf spring elements coupled to the printed circuit board;

one or more heat pipes over the cold plate; and a top plate over the one or more heat pipes, wherein the top plate is coupled to the retention mechanism to secure the top plate over the one or more heat pipes, wherein the leaf spring elements of the retention mechanism create an applied load on the cold plate in a direction towards the printed circuit board.

9. The electronic device of claim 8, wherein the cold plate includes a channel to accommodate the one or more heat pipes.

10. The electronic device of claim 8, wherein the top plate includes a channel to accommodate the one or more heat pipes.

11. The electronic device of claim 8, further comprising:

a package stiffener around the heat source, wherein when a load is applied on the sandwich plate heatsink, the sandwich plate heatsink does not come into contact with the package stiffener.

12. An electronic device comprising:

a printed circuit board;

a heat source located on the printed circuit board;

a package stiffener around the heat source; and a sandwich plate construction heatsink over the heat source, wherein the sandwich plate construction heatsink includes:

a cold plate over the heat source and coupled to a retention mechanism that includes leaf spring elements coupled to the printed circuit board;

a plurality of heat pipes over the cold plate; and a top plate over the plurality of heat pipes, wherein the top plate is coupled to the retention mechanism to secure the top plate over the plurality of heat pipes, wherein the leaf spring elements of the retention mechanism create an applied load on the cold plate in a direction towards the printed circuit board.

13. The electronic device of claim 12, wherein the cold plate includes a channel to accommodate the plurality of heat pipes.

14. The electronic device of claim 12, wherein the top plate includes a channel to accommodate the plurality of heat pipes.

* * * * *